US012597885B2

(12) United States Patent
Banerjee

(10) Patent No.: US 12,597,885 B2
(45) Date of Patent: Apr. 7, 2026

(54) ASSEMBLY FOR SOLAR PANELS WITH ULTRACAPACITOR-BATTERY HYBRID STORAGE SYSTEM

(71) Applicant: Sonjib Banerjee, Bengaluru (IN)

(72) Inventor: Sonjib Banerjee, Bengaluru (IN)

( * ) Notice: Subject to any disclaimer, the term of this patent is extended or adjusted under 35 U.S.C. 154(b) by 0 days.

(21) Appl. No.: 18/842,630

(22) PCT Filed: May 25, 2023

(86) PCT No.: PCT/IB2023/055367
§ 371 (c)(1),
(2) Date: Aug. 29, 2024

(87) PCT Pub. No.: WO2023/242655
PCT Pub. Date: Dec. 21, 2023

(65) Prior Publication Data
US 2025/0183843 A1      Jun. 5, 2025

(30) Foreign Application Priority Data

Jun. 17, 2022      (IN) .............................. 202241034767

(51) Int. Cl.
| | |
|---|---|
| *H02S 40/22* | (2014.01) |
| *H02S 10/10* | (2014.01) |
| *H02S 20/23* | (2014.01) |
| *H02S 30/10* | (2014.01) |
| *H02S 40/38* | (2014.01) |
| *H10F 19/90* | (2025.01) |
| *H10N 19/00* | (2026.01) |

(52) U.S. Cl.
CPC .............. *H02S 40/22* (2014.12); *H02S 10/10* (2014.12); *H02S 20/23* (2014.12); *H02S 30/10* (2014.12); *H02S 40/38* (2014.12); *H10F 19/902* (2025.01); *H10N 19/00* (2023.02)

(58) Field of Classification Search
None
See application file for complete search history.

(56) References Cited

U.S. PATENT DOCUMENTS 5,409,550 A * 4/1995 Safir ..................... H10F 77/488
                                                    136/246
2007/0074754 A1    4/2007 Farquhar et al.
(Continued)

FOREIGN PATENT DOCUMENTS

WO      WO-2017160704 A1 * 9/2017 ............. H10F 19/00

*Primary Examiner* — Ryan S Cannon
(74) *Attorney, Agent, or Firm* — S.J. INTELLECTUAL PROPERTY LTD.

(57) ABSTRACT

The present invention comprises solar tubes and other components arranged in a repetitive manner to form solar bricks. More specifically, the solar bricks (102) are assembled to form a solar panel that permits multiple direct and indirect reflection of solar radiation to achieve multiple reflection due to induced optical whirl of solar rays of visible spectrum that minimizes reflectance loss. The assembly (100) includes a 3rd dimension arrangement of solar cell in solar tube that allows to trap solar radiation and utilise higher solar cell area w.r.t horizontal earth surface. The assembly includes Peltier cells suitable to operate at low differential temperature for harnessing and used solar energy that is converted to heat. Further, solar thermal and full spectrum photovoltaic generation is combined to derive maximum efficiency.

11 Claims, 7 Drawing Sheets

(56)                    References Cited

U.S. PATENT DOCUMENTS

| 2007/0152154 A1* | 7/2007 | DeCamp ................. G01J 3/457 |
| | | 257/E27.15 |
| 2010/0089436 A1* | 4/2010 | Watters ................. H10F 77/488 |
| | | 136/246 |
| 2012/0006405 A1 | 1/2012 | Sutin |
| 2012/0285505 A9* | 11/2012 | McCoy, Jr. ............. H02S 30/10 |
| | | 136/246 |
| 2013/0063807 A1* | 3/2013 | Dam ..................... G02F 1/3534 |
| | | 359/326 |
| 2016/0099362 A1* | 4/2016 | Bellette ................... H10F 19/80 |
| | | 136/246 |
| 2016/0254781 A1* | 9/2016 | Pisharodi ............. H10F 77/488 |
| | | 136/246 |
| 2018/0040756 A1 | 2/2018 | Hu |
| 2018/0203285 A1* | 7/2018 | Safrani .................. G02F 1/135 |
| 2023/0041955 A1* | 2/2023 | Paik ..................... H10F 39/805 |

* cited by examiner 100          102

104

+ ve

-ve     To Battery

104

Protective glass  302

Down – conversion assembly 304

Fresnel lens 306

Height adjustment system   308

Solar cell  310

Up – conversion assembly  312

Mirror  314

Thermoelectric Generation  316

Fixing Arrangement

Approximate Dimensions in Inches (mm)

35x7.5 mm DIN Rail    35x15 mm DIN Rail    15x5.5 mm x 2m DIN Rail    XBANS35PL
Raised Rail

ASSEMBLY FOR SOLAR PANELS WITH ULTRACAPACITOR-BATTERY HYBRID STORAGE SYSTEM

The following complete specification particularly describes the invention and manner in which it is performed:

FIELD OF INVENTION

The embodiments described in the present disclosure relate generally to an assembly that comprises solar tubes and other components arranged in a repetitive manner to form solar bricks. More specifically, a 3-dimension arrangement of solar cell assembled to form a solar panel that permits multiple direct reflection and multiple indirect reflection of solar radiation to achieve multiple reflection due to induced optical whirl of solar rays of visible spectrum that minimizes reflectance loss.

BACKGROUND

Load centres are heavily dependent on energy transferred from utilities through elaborate electrical transmission and distribution systems, as the surface available for Photovoltaic (PV) generation does not allow them to meet their energy demand. The energy transfers from utilities mandate the use of transformers, transmission lines, trenching, cables, etc. hugely increasing carbon footprint, generation/transmission/distribution losses, pilferage, and susceptibility to fault/accidents/electrical hazards.

Conventional solar panels of monocrystalline, polycrystalline, PERC, Bifacial or HJT solar cells arranged in the X-Y plane can have a maximum theoretical efficiency of 33.7% with a bandgap of 1.34 eV. Practically the efficiency is between 18-25% and can produce appx 180 W/m2-250 W/m2. Thus, the present load centres need a large area for the PV generation to meet its power demand. Non-availability of sufficient PV generation area at the load centre makes it dependent on power from other utilities.

The incident solar radiation comprises of wavelengths between 300 nm to 2700 nm at sea level. For c-Si solar cells, Photon energy in wavelength between 300 nm to 900 nm collides with the electrons in the valence band of the solar cell substrate and helps the electron to jump the band gap and move to the conduction band. The energy required to jump the band gap is fixed for each type of solar substrate. Non-consumed energy of the photon gets converted into heat. Heat further reduces the s the efficiency of solar cells. Photon energy in wavelength between 900 to 2700 nm does not have the capacity to jump the electrons from the valance band to the conduction band and thus is unused. The conventional solar panel has no mechanism to alter incident wavelengths and has no capacity to mitigate losses due to bandgap.

After jumping the bandgap, the free electrons in the conduction band need to be collected by interlaced bus bars in the solar cells. The collected electrons in the bus bar are subjected to DC resistance of long cables between solar cell and battery. The DC impedance of such long cables between the solar cells and battery drops the collection efficiency of interlaced bus bars and additionally causes voltage drop with transmission losses.

Minimum loss due to reflectance in conventional solar assembly mandates the incident solar radiation to be within a specific degree to the solar surface. Thus, the conventional PV system employs complicated and heavy framework and structures to keep the solar cell at an appropriate angle w.r.t to the sun. Failure of such automatic arrangements result into power losses or sometimes disruption of generation.

Due to protruding solar panel structures it is susceptible to lightning strikes causing damage to expensive assets.

As the solar panel frames are arranged in linear arrays with other accessories it makes the maintenance of such systems extremely delicate, difficult, and expensive.

Shiny solar surfaces are susceptible to superficial damages like pecking of birds and scratches from abrasive dust particles.

Therefore, there exist a need for efficient PV generation assembly and an efficient mechanism.

OBJECT OF THE INVENTION

The principal object of the invention is to provide a solar assembly that enables an PV generation mechanism which need to reach above 600W/m2 such that load centers dependence on utility power is vastly reduced.

Another object of the invention is to provide a PV generation assembly which has an inbuilt storage mechanism.

Another object of the invention is to provide an PV generation assembly which is independent of sun's inclination.

These and other objects and characteristics of the present invention will become apparent from the further disclosure to be made in the detailed description given below.

SUMMARY OF THE INVENTION

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The invention provides an assembly that comprises solar tubes and other components arranged in a repetitive manner to form solar bricks. Further, the solar bricks are assembled to form a solar panel. The design of the solar panel, solar brick, and solar tube is elaborated along with their functional interdependence.

In some example embodiments, the assembly includes a plurality of solar bricks arranged in an interconnected manner. Each solar brick of the plurality of solar bricks is lined with ultracapacitors or ultracapacitors-battery hybrid storage system along a perimeter of the assembly.

In some example embodiments, each solar brick of the plurality of solar bricks includes a lattice of hexagonal tubular frames to affix solar cells. The tubular frames include a 3-dimensional arrangement of solar cell to trap the solar radiation, the interlaced storage system of consecutive bricks is connected in a series-parallel combination to achieve optimal charging voltage for external storage.

In some example embodiments, each tubular frame hexagonal arrangement comprises a protective glass, a down-conversion assembly, a radial Fresnel lens, a height adjustment system, a solar cell assembly, an up-conversion assembly, and a mirror assembly, the up-conversion assembly comprises multilayer components for Near-infrared (NIR), shortwave infrared (SWIR), mid-infrared (MIR) light to visible conversion.

In some example embodiments, the height adjustment system is positioned above the solar tube frame at an adjustable height. The height adjustment system makes the PV assembly independent of slope angle inclination.

In some example embodiments, the protective glass is a transparent protective cover or a protective glass that allows full solar spectrum radiation to enter the solar tube.

In some example embodiments, the protective glass is configured to provide a desired ingress protection (IP) rating and protection from impact and surface aberration.

In some example embodiments, the down-conversion assembly may comprise a down-conversion frame that is configured to hold multiple down conversion systems.

In some example embodiments, the radial Fresnel lens (306) distributes the incident rays to vertical or angular solar cell surface.

In some example embodiments, the assembly comprises a plurality of busbars or wires configured to transport free PV charge to the ultracapacitor or the ultracapacitor-battery hybrid system.

In some example embodiments, the assembly comprises an up-conversion frame to hold multiple up-conversion assembly.

In some example embodiments, a mirror assembly for visible light diverts the upconverted light back to solar cells mounted in into the tubular arrangement.

In some example embodiments, a mirror assembly is a convex, plano-convex or prism mirror that is positioned at the bottom of the geometrical tube frame.

In some example embodiments, the plurality of solar bricks is mounted on roof over system of DIN rails.

In some example embodiments, the heat from the solar brick is extracted by a thermoelectric generator.

In some example embodiments, the photovoltaic energy is combined with thermoelectric energy to maximize efficiency.

These together with other objects of the invention, along with the various features of novelty which characterize the invention, are pointed out with particularity in the disclosure. For a better understanding of the invention, its operating advantages and the specific objects attained by its uses, reference should be had to the accompanying drawings and descriptive matter in which there are illustrated preferred embodiments of the invention.

BRIEF DESCRIPTION OF DRAWINGS

The foregoing and other features of embodiments will become more apparent from the detailed description of embodiments when read in conjunction with the accompanying drawings to be submitted during the submission of complete patent specification.

DETAILED DESCRIPTION OF INVENTION

The embodiments herein and the various features and advantageous details thereof are explained more fully with reference to the non-limiting embodiments that are illustrated and detailed in the following description. Descriptions of well-known components and processing techniques are omitted so as to not unnecessarily obscure the embodiments herein. The examples used herein are intended merely to facilitate an understanding of ways in which the embodiments herein may be practised and to further enable those of skill in the art to practice the embodiments herein. Accordingly, the examples should not be construed as limiting the scope of the embodiments herein.

Reference in this specification to "one embodiment" or "an embodiment" means that a particular feature, structure, or characteristic described in connection with the embodiment is included in at least one embodiment of the present disclosure. The appearance of the phrase "in an embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

Moreover, although the following description contains many specifics for the purposes of illustration, anyone skilled in the art will appreciate that many variations and/or alterations to said details are within the scope of the present disclosure. Similarly, although many of the features of the present disclosure are described in terms of each other, or in conjunction with each other, one skilled in the art will appreciate that many of these features can be provided independently of other features. Accordingly, this description of the present disclosure is set forth without any loss of generality to, and without imposing limitations upon the present disclosure.

Embodiments of the present disclosure illustrates an PV generation assembly (100) that comprises solar tubes and other components arranged in a repetitive manner to form solar bricks. Further, the solar bricks are assembled to form a solar panel. The design of the solar panel, solar brick, and solar tube is elaborated along with their functional interdependence from FIG. 1 to FIG. 6.

Figure 1:
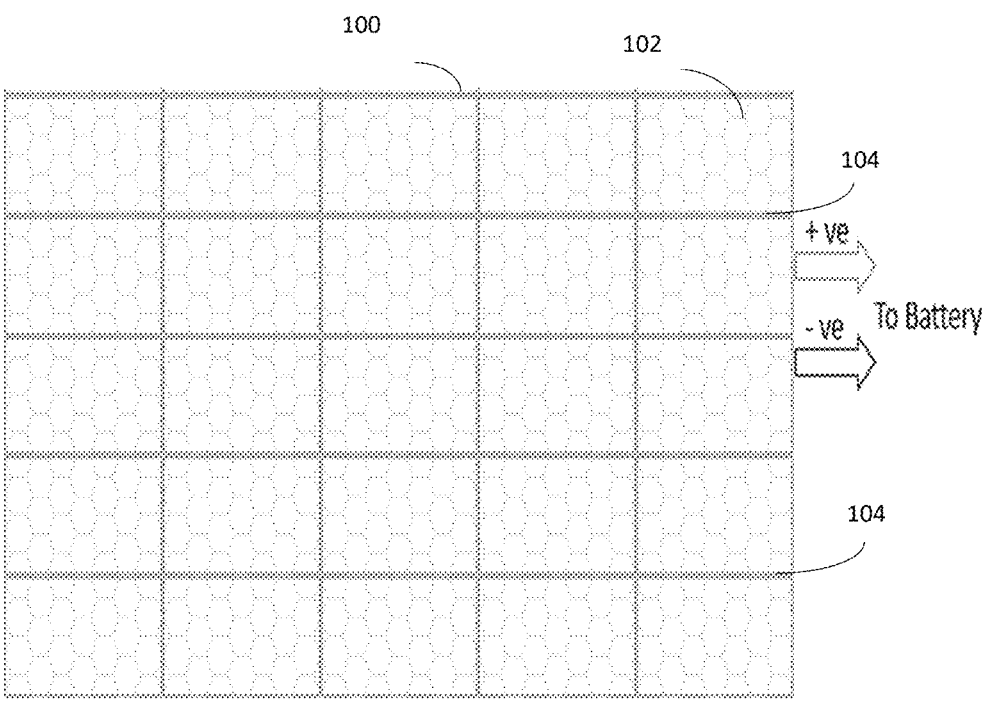
FIG. 1 illustrates an assembly of a solar brick stack, according to one embodiment of the invention.

FIG. 1 illustrates a PV generation assembly (100) ("assembly", hereinafter) of a solar brick stack, according to one embodiment of the invention. The assembly (100) is a modular design which adopts the placement of interconnected solar bricks (102) in a given area. The solar bricks (102) are lined with ultracapacitors or ultracapacitors-battery hybrid storage systems along the perimeter (104) represented in FIG. 1. The interlaced storage system (battery) is connected to the assembly (100) in a series-parallel combination to achieve higher voltages, minimizing current, DC resistance losses and voltage drop of the busbar/cables transmitting the energy to the external storage system like a battery.

Figure 2:
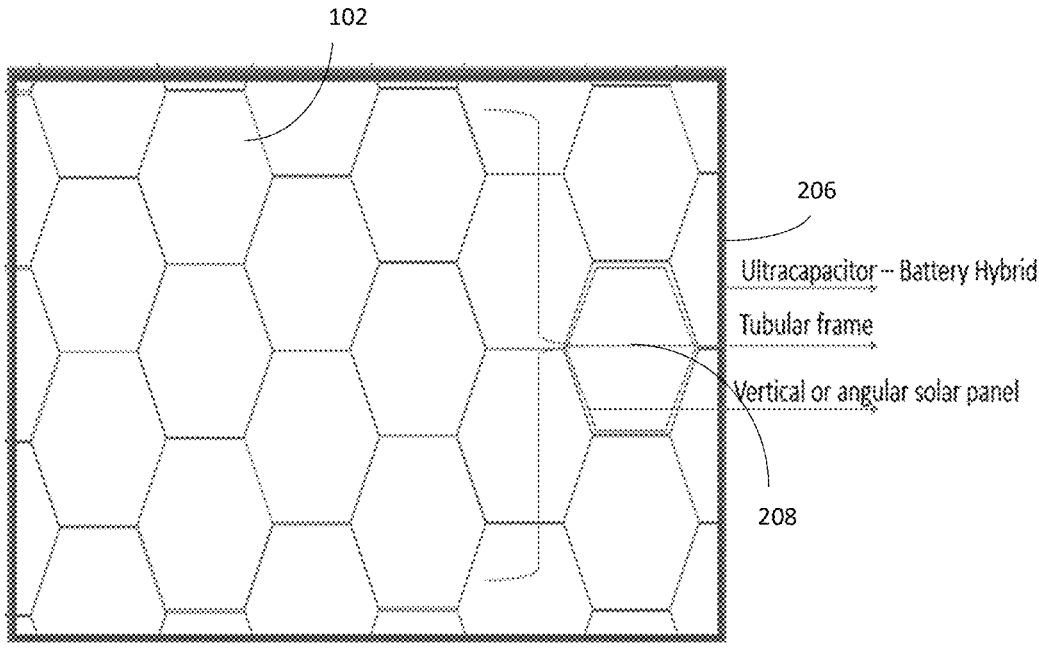
FIG. 2 illustrates a top view of a single brick of the solar brick stack, according to one embodiment of the invention.

FIG. 2 illustrates a top view of a single brick (102). The single brick (102) houses a lattice of hexagonal (or other geometrical shapes) tubular frames to affix the solar cells. The lattice of hexagonal shapes is herein shown for illustration purpose. However, manufacturers may choose various geometrical shapes of tubular arrangement to adopt the assembly (100), based on ease of manufacturing, geographical considerations, or location.

In some example embodiments, the assembly (100) includes the ultracapacitors or ultracapacitors-battery hybrid storage system (206) that is placed on the perimeter of each solar brick and forms the bulk of the frame to hold the solar tubes, as represented in FIG. 2. The interlaced storage system of consecutive bricks is connected in a series-parallel combination to achieve optimal charging voltage for external storage. The solar brick (102) may further comprise a tubular frame (208).

Figure 3:
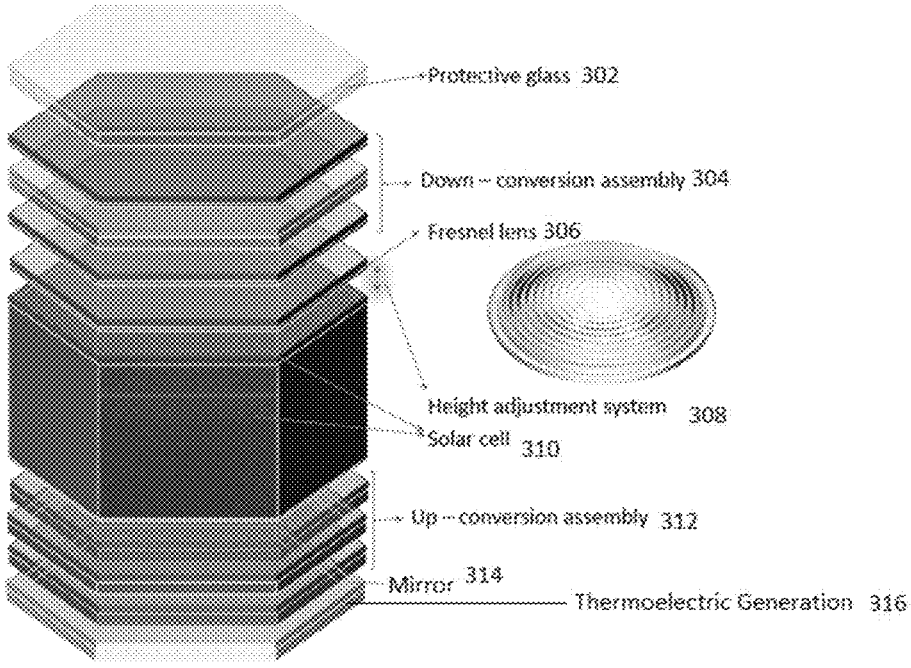
FIG. 3 illustrates an example of tubular frame component of hexagonal arrangement with radial Fresnel lens and convex, plano-convex or prism mirror assembly, according to one embodiment of the invention.

FIG. 3 illustrates a general alignment of components in tubular frame (208) of the solar brick (102). In some example embodiments, the solar cells are placed along an inner wall or an outer wall of each tubular frame (208) as per the required alignment.

In some example embodiments, tubular frame component (208) of hexagonal arrangement may comprise a protective glass (302), a down-conversion assembly (304), a radial Fresnel lens (306), a height adjustment system (308), a solar cell assembly (310), an up-conversion assembly (312), a mirror assembly (314) and a thermoelectric generator assembly (316).

In some example embodiments, the protective glass (302) may be a transparent protective cover or a protective glass that allows full solar spectrum radiation to enter into the solar tube. The protective glass (302) may provide desired ingress protection (IP) rating and protection from impact and surface aberration.

In some example embodiments, the down-conversion assembly (304) may comprise multilayer components for UV light to visible light conversion. In some example embodiments, the down-conversion assembly (304) may comprise a down-conversion frame that is configured to hold multiple down conversion systems.

In some example embodiments, a height adjustment system (308) may comprise a radial Fresnel lens (306) that distributes the incident rays to vertical or angular solar cell surface. The height adjustment system make the assembly (100) independent of slope angle inclination.

In some example embodiments, solar cell assembly (310) may comprise three components. The solar cells arranged on the walls of tubular frame. The solar cells can be arranged in various possible geometries. In some example embodiments, a plurality of terminals configured to enable series and parallel connection of solar cells inside the tubular frame.

In some example embodiments, the assembly (100) further comprises a plurality of busbars or wires configured to transport free PV charge to ultracapacitor or ultracapacitor-battery hybrid system.

In some example embodiments, the up-conversion assembly (312) may comprise multilayer components for Near-infrared (NIR), shortwave infrared (SWIR), mid-infrared (MIR) light to visible conversion. The assembly (100) may further comprise an up-conversion frame to hold multiple up-conversion assembly (312).

In some example embodiments, a mirror assembly (314) diverts the upconverted light back to solar cells mounted in into the tubular arrangement.

Figure 4:
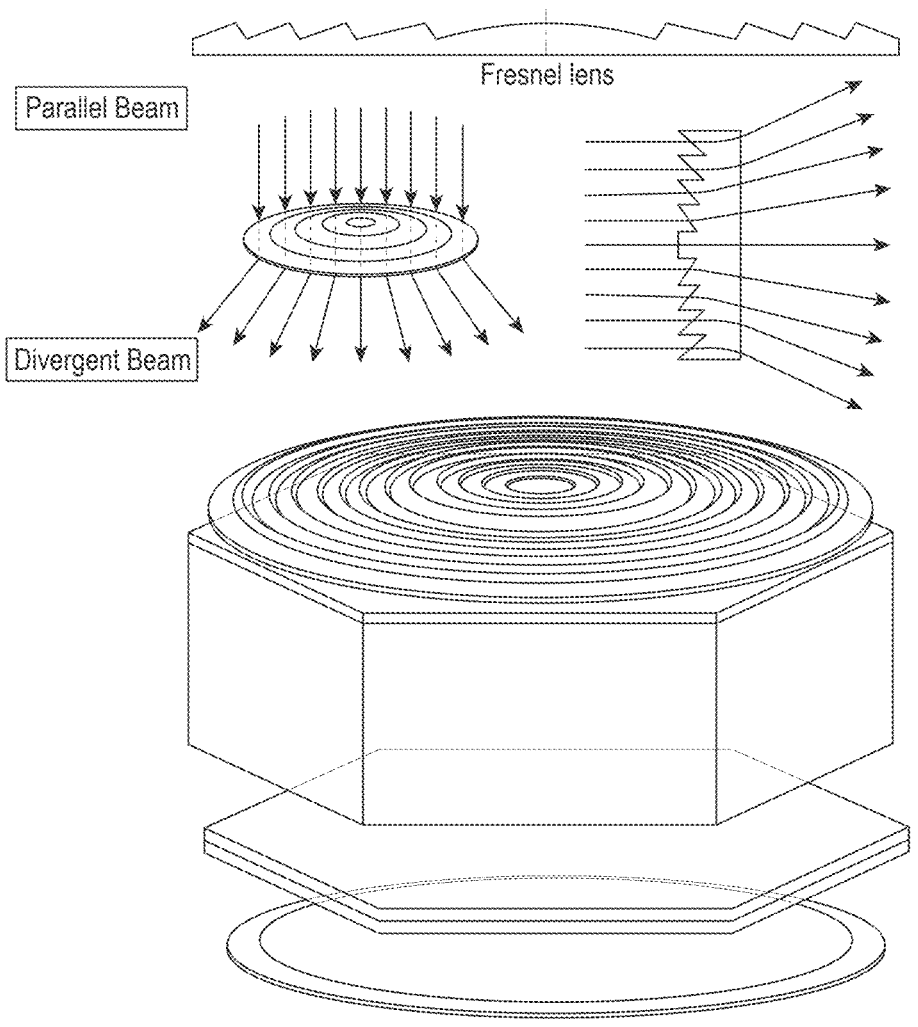
FIG. 4 illustrates radial Fresnel Lens on hexagonal tubular frame and Divergent Lens ray Diagram, according to one embodiment of the invention.

FIG. 4 illustrates radial Fresnel Lens on hexagonal tubular frame and Divergent Lens ray Diagram. In some example embodiments, the height adjustment system (306) is positioned above the solar tube frame at an adjustable height as shown in FIG. 4. The height adjustment system allows lens assembly to direct maximum incident light at all solar inclinations to the wall-mounted solar cells inside the tube at maximum reflectance efficiency.

a mirror assembly (314) is a convex, plano-convex or prism mirror assembly is positioned at the bottom of the geometrical tube frame as shown in FIG. 4 to redirect the converted IR radiations back to the solar tube for PV generation.

Working of the Assembly (100)

Figure 5:
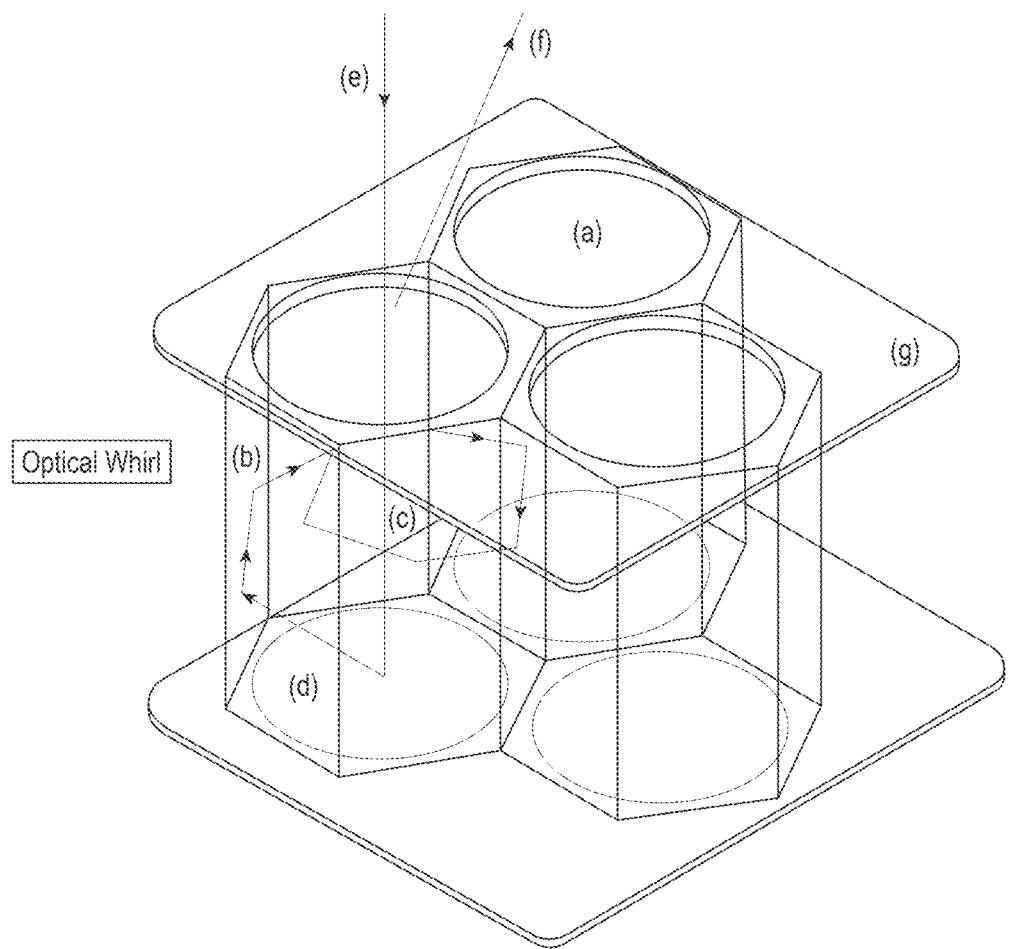
FIG. 5 illustrates multiple reflection and optical whirl, according to one embodiment of the invention.

The assembly (100) includes a mechanism of a multiple direct and indirect reflection of radiation that achieves an optical whirl of solar rays as shown in FIG. 5. Such an arrangement may harness full-spectrum solar radiation energy thus providing higher PV generation efficiency.

In some example embodiments, after necessary up conversion and down conversions, there are still portion of the solar energy is converted into heat. The solar brick is lined with solar paint with low emissivity also as to heat the peripheral body of the solar brick. The brick is lined with thermal coating to minimise heat transfer to the photovoltaic conversion mechanisms. Below the photovoltaic enclosure, Peltier cell assembly is placed along with suitable heat sink. The solar radiation heats one surface of the Peltier cell, whereas the heat sink keeps the other surface cool. The difference in temperature is converted by Peltier cell into electricity. Electricity generated by the solar thermal and photovoltaic system is fed to a PCB for voltage regulation and synchronisation to get a desired output voltage. The resultant output voltage is used to charge the ultracapacitor battery hybrid system.

Example for the Installation of the Assembly (100)

Figure 6A:
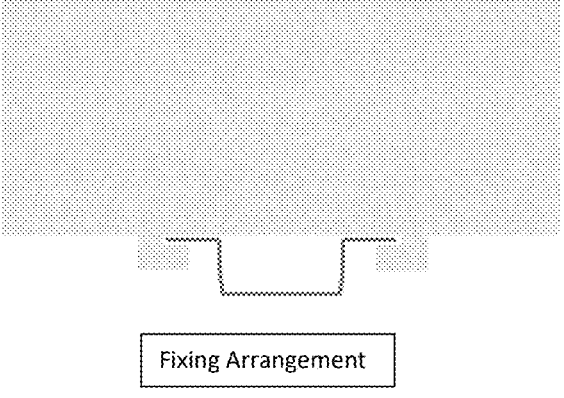
FIGS. 6A and 6B illustrate mounting of solar cell on DIN rail with various types of DIN rail mounting assembly, according to one embodiment of the invention.
Figure 6B:
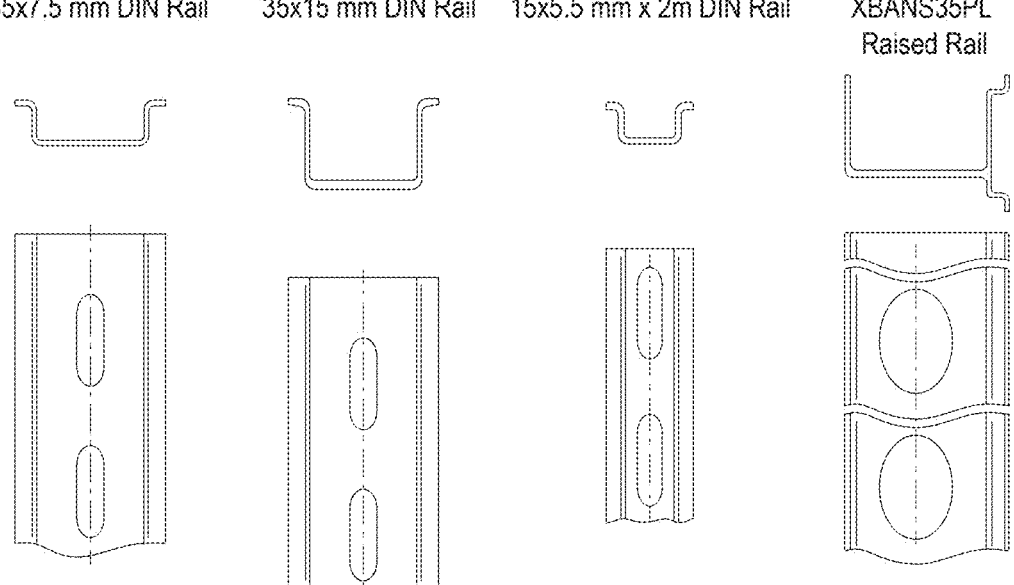

FIGS. 6A and 6B illustrate mounting of solar cell on DIN rail with various types of DIN rail mounting assembly, according to one embodiment of the invention. As the solar bricks (102) does not need system of inclination assembly or network of frames, it can directly be mounted on roof over system of DIN rails as shown in FIG. 6A. Any other type of fixtures can also be used based on local applications. The different dimensions are illustrated in FIG. 6B.

Novel Aspects of the Assembly (100):

PV generation efficiency of the assembly (100) is multiple times higher than an equivalent conventional solar cell arrangement. Higher efficiency is possible due to following novel ideas incorporated in the assembly (100).

The assembly (100) permits multiple direct and indirect reflection of solar radiation to achieve multiple reflection due to induced optical whirl of solar rays of visible spectrum that minimizes reflectance loss.

Positioning of system of Up and Down-Conversion assembly, and a mirror assembly in the assembly (100) in a way to allow commercially available solar cells to harness full spectrum of solar radiation, minimising band gap losses of solar substrate.

Height adjustment system (306) makes the assembly (100) independent of slope angle inclination. Introduction of a 3rd dimension arrangement of solar cell in solar tube allows to trap solar radiation and utilise higher solar cell area w.r.t horizontal earth surface irrespective of slope angle. Solar thermal and full spectrum photovoltaic generation is combined to derive maximum efficiency.

Ultracapacitors or ultracapacitor-battery hybrid storage system positioned at the boundary of solar brick increases the evacuation efficiency of electrons in conduction band thru interlaced busbars of solar cell. Electricity generated by the solar thermal and photovoltaic system is fed to a PCB for voltage regulation and synchronisation to get a desired output voltage. The resultant output voltage is used to charge the ultracapacitor battery hybrid system.

Analytical Justification

Table1 compiles the various losses encountered by the conventional 2-D assembly of single-junction C—Si solar cell and shows its efficiency in percentage.

TABLE 1

| | | | Wave length | | | |
|---|---|---|---|---|---|---|
| nm | Energy Ev | Solar irradiation at sea level Wm$^{-2}$µm$^{-1}$ | Usable Solar irradiation due to fixed band gap of 1.1 eV Wm$^{-2}$µm$^{-1}$ | Absorption factor of 100 nm thick single junction solar cell % | Reflectance of n-PERT 219 with EVA and 3.2 mm glass % | Usable solar energy after absorption factor and reflectance Wm$^{-2}$µm$^{-1}$ |
| 300 | 4.14 | 100 | 0 | 0 | 0 | 0.00 |
| 400 | 3.10 | 900 | 319.18 | 62% | 4.0% | 189.98 |
| 500 | 2.48 | 1200 | 531.97 | 85% | 1.0% | 447.65 |
| 600 | 2.07 | 1150 | 611.76 | 92% | 0.0% | 562.82 |
| 700 | 1.77 | 1000 | 620.63 | 90% | 0.0% | 558.56 |
| 800 | 1.55 | 800 | 567.43 | 86% | 0.3% | 486.53 |
| 900 | 1.38 | 300 | 239.38 | 84% | 0.6% | 0.00 |
| 1000 | 1.24 | 600 | 531.97 | 82% | 0.9% | 0.00 |
| 1100 | 1.13 | 200 | 195.05 | 80% | 1.2% | 0.00 |
| 1200 | 1.03 | 350 | 0.00 | 78% | 1.5% | 0.00 |
| 1300 | 0.95 | 300 | 0.00 | 76% | 1.8% | 0.00 |
| 1400 | 0.89 | 0 | 0.00 | 74% | 2.1% | 0.00 |
| 1500 | 0.83 | 150 | 0.00 | 72% | 2.4% | 0.00 |
| 1600 | 0.78 | 200 | 0.00 | 70% | 2.7% | 0.00 |
| 1700 | 0.73 | 175 | 0.00 | 68% | 3.0% | 0.00 |
| 1800 | 0.69 | 150 | 0.00 | 66% | 3.3% | 0.00 |
| 1900 | 0.65 | 0 | 0.00 | 64% | 3.6% | 0.00 |
| 2000 | 0.62 | 50 | 0.00 | 62% | 3.9% | 0.00 |
| 2100 | 0.59 | 50 | 0.00 | 60% | 4.2% | 0.00 |
| 2200 | 0.56 | 50 | 0.00 | 58% | 4.5% | 0.00 |
| 2300 | 0.54 | 50 | 0.00 | 56% | 4.8% | 0.00 |
| 2400 | 0.52 | 50 | 0.00 | 54% | 5.1% | 0.00 |
| 2500 | 0.50 | 50 | 0.00 | 52% | 5.4% | 0.00 |
| 2600 | 0.48 | 30 | 0.00 | 50% | 5.7% | 0.00 |
| 2700 | 0.46 | 0 | 0.00 | 48% | 6.0% | 0.00 |
| Efficiency | | | 46% | | | 28% |

Best of the single junction solar cell may produce 280W/m2 . . . . Presently available efficiencies are between 22 to 25%. As per Shockley and Queisser for a single-junction cell with 1.34 eV band-gap, a theoretical peak performance is about 33.7%, or about 337 W/m2, Increased Efficiency of the Assembly (100)

Example 1

Table 2 shows an example of solar panel using 3-D assembly (100) design idea that can generate more PV energy using the same C—Si solar cells used in above example and considering only 30% DOWN-CONVERSION efficiency and 20% NIR, 5% SWIR/MIR UP-CONVERSION efficiency.

TABLE 2

| | | | Wave length | | |
|---|---|---|---|---|---|
| Nm | Energy ev | Solar irradiation at sea level Wm$^{-2}$µm$^{-1}$ | Efficiency enhancement due to down-conversion with 30% efficiency Wm$^{-2}$µm$^{-1}$ | Efficiency enhancement due to Up-conversion with 20% of NIR, 5% for MIR/SWIR efficiency Wm$^{-2}$µm$^{-1}$ | Usable Solar irradiation due to fixed band gap of 1.1 eV Wm$^{-2}$µm$^{-1}$ |
| 300 | 4.14 | 100 | 0.00 | 0.00 | 0.00 |
| 400 | 3.10 | 900 | 630.00 | 630.00 | 223.43 |
| 500 | 2.48 | 1200 | 1200.00 | 1402.50 | 621.73 |
| 600 | 2.07 | 1150 | 1180.00 | 1316.25 | 700.20 |
| 700 | 1.77 | 1000 | 1000.00 | 1065.00 | 660.97 |
| 800 | 1.55 | 800 | 1070.00 | 1147.50 | 813.91 |
| 900 | 1.38 | 300 | 0.00 | 0.00 | 0.00 |
| 1000 | 1.24 | 600 | 0.00 | 0.00 | 0.00 |
| 1100 | 1.13 | 200 | 0.00 | 0.00 | 0.00 |
| 1200 | 1.03 | 350 | 0.00 | 0.00 | 0.00 |
| 1300 | 0.95 | 300 | 0.00 | 0.00 | 0.00 |
| 1400 | 0.89 | 0 | 0.00 | 0.00 | 0.00 |

TABLE 2-continued

| | | | | Wave length | |
|---|---|---|---|---|---|
| Nm | Energy ev | Solar irradiation at sea level Wm$^{-2}$μm$^{-1}$ | Efficiency enhancement due to down - conversion with 30% efficiency Wm$^{-2}$μm$^{-1}$ | Efficiency enhancement due to Up - conversion with 20% of NIR, 5% for MIR/SWIR efficiency Wm$^{-2}$μm$^{-1}$ | Usable Solar irradiation due to fixed band gap of 1.1 eV Wm$^{-2}$μm$^{-1}$ |
| 1500 | 0.83 | 150 | 0.00 | 0.00 | 0.00 |
| 1600 | 0.78 | 200 | 0.00 | 0.00 | 0.00 |
| 1700 | 0.73 | 175 | 0.00 | 0.00 | 0.00 |
| 1800 | 0.69 | 150 | 0.00 | 0.00 | 0.00 |
| 1900 | 0.65 | 0 | 0.00 | 0.00 | 0.00 |
| 2000 | 0.62 | 50 | 0.00 | 0.00 | 0.00 |
| 2100 | 0.59 | 50 | 0.00 | 0.00 | 0.00 |
| 2200 | 0.56 | 50 | 0.00 | 0.00 | 0.00 |
| 2300 | 0.54 | 50 | 0.00 | 0.00 | 0.00 |
| 2400 | 0.52 | 50 | 0.00 | 0.00 | 0.00 |
| 2500 | 0.50 | 50 | 0.00 | 0.00 | 0.00 |
| 2600 | 0.48 | 30 | 0.00 | 0.00 | 0.00 |
| 2700 | 0.46 | 0 | 0.00 | 0.00 | 0.00 |
| Total Efficiency | | 7905 | 5080.00 64.26% | 5561.25 70.35% | 3020.23 38.21% |

Photovoltaic generation of the assembly (100) of the commercially available solar cell can produce 382.1 W/m$^2$—with appx 38.2% efficiency vis a vis 22 to 28% efficiency of conventional solar cell. An addition of 102.1 W/m2 over 280 W/m2 is appx 36.4% increase in efficiency.

The solar thermal generation system efficiency adds another 10% to the efficiency of the assembly (100). This increases the net efficiency of the assembly (100) to over 48.2%.

Example 2

Up-conversion and down-conversion efficiency is quickly changing. Enhancement of these efficiency will increase the efficiency of the assembly (100) significantly. An example due to such enhancement with 75% down—conversion efficiency and 75% NIR, 25% SWIR/MIR up—conversion efficiency is shown in Table 3.

TABLE 3

| | | | | Wave length | |
|---|---|---|---|---|---|
| nm | Energy Ev | Solar irradiation at sea level Wm$^{-2}$μm$^{-1}$ | Efficiency enhancement due to down - conversion with 75% efficiency Wm$^{-2}$μm$^{-1}$ | Efficiency enhancement due to down - conversion with 75% of NIR, 25% for MIR/SWIR efficiency Wm$^{-2}$μm$^{-1}$ | Usable Solar irradiation due to fixed band gap of 1.1 eV Wm$^{-2}$μm$^{-1}$ |
| 300 | 4.14 | 100 | 0.00 | 0.00 | 0.00 |
| 400 | 3.10 | 900 | 630.00 | 630.00 | 223.43 |
| 500 | 2.48 | 1200 | 1200.00 | 1987.50 | 881.07 |
| 600 | 2.07 | 1150 | 1225.00 | 1768.75 | 940.91 |
| 700 | 1.77 | 1000 | 1000.00 | 1250.00 | 775.78 |
| 800 | 1.55 | 800 | 1475.00 | 1775.00 | 1258.98 |
| 900 | 1.38 | 300 | 0.00 | 0.00 | 0.00 |
| 1000 | 1.24 | 600 | 0.00 | 0.00 | 0.00 |
| 1100 | 1.13 | 200 | 0.00 | 0.00 | 0.00 |
| 1200 | 1.03 | 350 | 0.00 | 0.00 | 0.00 |
| 1300 | 0.95 | 300 | 0.00 | 0.00 | 0.00 |
| 1400 | 0.89 | 0 | 0.00 | 0.00 | 0.00 |
| 1500 | 0.83 | 150 | 0.00 | 0.00 | 0.00 |
| 1600 | 0.78 | 200 | 0.00 | 0.00 | 0.00 |
| 1700 | 0.73 | 175 | 0.00 | 0.00 | 0.00 |
| 1800 | 0.69 | 150 | 0.00 | 0.00 | 0.00 |
| 1900 | 0.65 | 0 | 0.00 | 0.00 | 0.00 |
| 2000 | 0.62 | 50 | 0.00 | 0.00 | 0.00 |
| 2100 | 0.59 | 50 | 0.00 | 0.00 | 0.00 |
| 2200 | 0.56 | 50 | 0.00 | 0.00 | 0.00 |
| 2300 | 0.54 | 50 | 0.00 | 0.00 | 0.00 |
| 2400 | 0.52 | 50 | 0.00 | 0.00 | 0.00 |
| 2500 | 0.50 | 50 | 0.00 | 0.00 | 0.00 |

TABLE 3-continued

| | | | | Efficiency enhancement | |
| | | | Efficiency | due to down - | Usable |
| | | | enhancement | conversion | Solar |
| | | Solar | due to down - | with 75% of | irradiation |
| | | irradiation | conversion | NIR, 25% for | due to fixed |
| | | at sea | with 75% | MIR/SWIR | band gap of |
| | Energy | level | efficiency | efficiency | 1.1 eV |
| nm | Ev | $Wm^{-2}\mu m^{-1}$ | $Wm^{-2}\mu m^{-1}$ | $Wm^{-2}\mu m^{-1}$ | $Wm^{-2}\mu m^{-1}$ |
|---|---|---|---|---|---|
| 2600 | 0.48 | 30 | 0.00 | 0.00 | 0.00 |
| 2700 | 0.46 | 0 | 0.00 | 0.00 | 0.00 |
| Efficiency | | | 69.96% | 93.75% | 51.62% |

Photovoltaic generation of the assembly (100) of the commercially available solar cell can produce 516.2 W/m2 with appx 51.62% W/m2. vis a vis 22 to 28% efficiency of conventional solar cell. An addition of 236.2 W/m2 over 280 W/m2 is appx 84.6% increase in efficiency.

The solar thermal generation system efficiency adds another 10% to the efficiency of the assembly (100). This increases the net efficiency of the assembly (100) to over 61.62%.

Inference

The table 3 shows that the efficiency of harnessing solar energy has increased from 28% to 61.62% for commercially available solar cells, improving the output by 2.2 times relative to planar solar panel. Thus, electrical utility distribution system assets can be minimized and limited for catering to backup power or maximum demand only The many features and advantages of the invention are apparent from the detailed specification, and thus, it is intended by the appended claims to cover all such features and advantages of the invention, which fall within the true spirit, and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

The invention claimed is:

1. A Photovoltaic (PV) generation assembly (100) for permitting multiple direct reflections and multiple indirect reflections of solar radiation, characterized:
   a plurality of solar bricks (102) arranged in an interconnected manner,
      each solar brick (102) of the plurality of solar bricks (102) is lined with ultracapacitors or ultracapacitors-battery hybrid storage system (206) along a perimeter (104) of the PV generation assembly (100), the hybrid storage system (206) is connected in a series-parallel combination to achieve optimal charging voltage for an external storage,
      each solar brick (102) of the plurality of solar bricks (102) includes a lattice of hexagonal tubular frames (208) to affix solar cells, the hexagonal tubular frames (208) include a 3-dimensional arrangement of solar cells to trap the solar radiation,
      each tubular frame (208) defining an enclosed solar radiation receiving region comprises:
      a protective glass (302) configured to allow solar radiation to enter the tubular frame (208), a radial Fresnel lens (306) positioned to distribute incident solar radiation toward internal surfaces of the tubular frame (208), a height adjustment system (308),
   a solar cell assembly (310) comprising one or more solar cells arranged on the internal surfaces of the tubular frame (208) in a plurality of geometries, and
   a mirror (314) positioned to divert non-absorbed solar radiation back into the tubular frame (208),
   wherein the radial Fresnel lens (306), the mirror (314), and the internal surfaces of the tubular frame (208) cooperatively permit solar radiation entering the tubular frame (208) to undergo multiple direct reflections and multiple indirect reflections to induce an optical whirl within the tubular frame (208), thereby enabling repeated interaction of the solar radiation with the one or more solar cells arranged on the internal surfaces; and
   wherein electrical output from the one or more solar cells is routed to the external storage arranged along the perimeter (104),
   the height adjustment system (306) is positioned above the tubular frames (208) at an adjustable height, and
   the height adjustment system (306) makes the PV assembly (100) independent of slope angle inclination.

2. The PV assembly (100) as claimed in claim 1, wherein the protective glass (302) is a transparent protective cover or a protective glass that allows full solar spectrum radiation to enter the tubular frame.

3. The PV assembly (100) as claimed in claim 1, wherein the protective glass (302) is configured to provide a desired ingress protection (IP) rating and protection from impact and surface aberration.

4. The PV assembly (100) as claimed in claim 1, further comprising a down-conversion assembly (304) comprising a down-conversion frame that is configured to hold multiple down conversion systems.

5. The PV assembly (100) as claimed in claim 1, wherein the radial Fresnel lens (306) distributes the incident rays to vertical or angular solar cell surfaces.

6. The PV assembly (100) as claimed in claim 1, wherein the assembly (100) comprises a plurality of busbars or wires configured to transport free PV charge to the ultracapacitor or the ultracapacitor-battery hybrid system.

7. The PV assembly (100) as claimed in claim 1, wherein the assembly (100) further comprises an up-conversion frame to hold multiple up-conversion assembly (312).

8. The PV assembly (100) as claimed in claim 1, wherein the mirror (314) diverts the upconverted light back to solar cells mounted within the tubular frame (208).

9. The PV assembly (100) as claimed in claim 1, wherein the mirror (314) is a convex/plano-convex/prism mirror that is positioned at the bottom of the tubular frame.

10. The PV assembly (100) as claimed in claim 1, further comprising a thermoelectric generator assembly (316) configured to extract heat from the solar brick to maximize conversion efficiency by combining photovoltaic energy with thermoelectric energy.

11. The PV assembly (100) as claimed in claim 1, wherein the plurality of solar bricks (102) is mounted on roof over a system of DIN rails.

\* \* \* \* \*